United States Patent
Wang et al.

(10) Patent No.: US 6,711,421 B2
(45) Date of Patent: Mar. 23, 2004

(54) STRUCTURAL REINFORCED SUPERCONDUCTING CERAMIC TAPE AND METHOD OF MAKING

(75) Inventors: Yu Wang, Clifton Park, NY (US); Evangelos Trifon Laskaris, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 312 days.

(21) Appl. No.: 09/682,598

(22) Filed: Sep. 25, 2001

(65) Prior Publication Data

US 2003/0059652 A1 Mar. 27, 2003

(51) Int. Cl.$^7$ ............... H01L 39/00; H01F 6/00; H01B 12/00
(52) U.S. Cl. ............ 505/166; 505/237; 310/261; 428/702
(58) Field of Search ............... 505/166, 237, 505/230, 231; 310/261, 52

(56) References Cited

U.S. PATENT DOCUMENTS

| | | | | |
|---|---|---|---|---|
| 3,626,341 A | * | 12/1971 | Dao ................ | 335/216 |
| 5,093,311 A | * | 3/1992 | Shiota et al. ........ | 505/232 |
| 5,777,420 A | * | 7/1998 | Gamble et al. ....... | 310/261 |
| 5,801,124 A | | 9/1998 | Gamble et al. | |
| 5,863,336 A | | 1/1999 | Tkaczyk et al. | |
| 5,874,175 A | * | 2/1999 | Li .................. | 428/457 |
| 5,987,342 A | * | 11/1999 | Scudiere et al. ...... | 505/230 |
| 6,110,606 A | * | 8/2000 | Scudiere et al. ...... | 428/629 |
| 6,143,432 A | * | 11/2000 | de Rochemont et al. | 428/689 |
| 6,444,917 B1 | * | 9/2002 | Scudiere et al. ..... | 174/125.1 |
| 6,469,253 B1 | * | 10/2002 | Saga et al. .......... | 174/125.1 |
| 6,507,746 B2 | * | 1/2003 | Kaneko .............. | 505/231 |
| 6,509,819 B2 | * | 1/2003 | Snitchler et al. .... | 335/216 |
| 6,600,939 B1 | * | 7/2003 | Zhao ................ | 505/231 |

OTHER PUBLICATIONS

Christopher G. King et al.: "Mechanical Stabilization of BSCCO–2223 Superconducting Tapes," IEEE Transactions on Applied Superconductivity, Jun. 1997, pp. 2046–2050, vol. 7, No. 2, IEEE, Jun. 1997.
Kenneth G. Herd et al.: "Development and Fabrication of a Bi–2223 Racetrack Coil for Generator Applications," IEEE Transactions on Applied Superconductivity, Jun. 1997, pp. 531–534, vol. 7, No. 2, IEEE, Jun. 1997.
Howard E. Boyer et al.: "Metals Handbook, Desk Edition," pp. 1•44–1•48, 1•51, 2•6, 29•14–29•42, American Society for Metals, Metals Park, Ohio, no date available.

* cited by examiner

Primary Examiner—Tom Dunn
Assistant Examiner—Colleen P. Cooke
(74) Attorney, Agent, or Firm—Foley & Lardner

(57) ABSTRACT

There is provided a reinforced superconducting tape. The reinforced tape includes a superconducting tape containing a superconducting ceramic material, a first metal reinforcing layer having a greater coefficient of thermal expansion than that of the superconducting tape, and a second metal reinforcing layer having a greater modulus of elasticity than the superconducting tape and the first reinforcing layer.

37 Claims, 6 Drawing Sheets

STRUCTURAL REINFORCED SUPERCONDUCTING CERAMIC TAPE AND METHOD OF MAKING

BACKGROUND OF INVENTION

The present invention relates generally to superconducting tape, and more particularly to a metal reinforced superconducting tape.

Synchronous electrical machines having field coil windings include, but are not limited to, rotary generators and rotary motors. These machines generally comprise a stator and rotor that are electromagnetically coupled. The rotor may include a multi-pole rotor core and one or more coil windings mounted on the rotor core. The rotor cores may include a magnetically-permeable solid material, such as an iron-core rotor.

Recently, superconducting coil windings have been developed for rotors. Superconducting coils are advantageous because they have effectively no resistance. High temperature superconducting coil windings are formed of brittle ceramic superconducting tape. The tape may be formed of a high temperature superconducting material, such as a $Bi_{1.8}$ $Pb_{0.4}$ $Sr_2$ $Ca_2$ $Cu_3$ $O_{10+x}$ (BSCCO 2223), $Bi_2$ $Sr_2$ $Ca_1$ $Cu_2$ $O_{8+x}$ (BSCCO 2212), and $YBa_2$ $Cu_3$ $O_{7-x}$ (YBCO 123). This tape must be cooled to a temperature at or below a critical temperature to achieve and maintain superconductivity.

When this superconducting tape is put under tension, the ceramic grains in the tape degrade, resulting in a decrease in the critical current carrying capability of the superconducting tape. To address this issue, a paper by K. G. Herd et al. titled "Development and Fabrication of a Bi-2223 Racetrack Coil for Generator Applications", in IEEE Transactions on Applied Superconductivity, Vol. 7, No. 2 (June 1997) page 531, incorporated herein by reference, describes an epoxy impregnated silver sheathed BSCCO 2223 superconducting tape laminated to copper foils for strength enhancement.

Furthermore, U.S. Pat. No. 5,987,342, incorporated herein by reference, discloses laminating the superconducting tape to a pre-tensioned metal (i.e., steel, copper or superalloy) tape having a thermal expansion coefficient greater than that of the superconducting tape. The metal tape may be laminated to the superconducting tape using solder, epoxy or solderless ultrasonic welding. As the tapes cool after a high temperature lamination, the metal tape causes the superconducting tape to be placed under compression due to the difference in the coefficients in thermal expansion and due to the pre-tensioning of the metal tape. The metal tape improves the superconducting tape's tolerance to tensile and bending stresses, by placing the superconducting tape under compression.

SUMMARY OF INVENTION

In accordance with one preferred aspect of the present invention, there is provided a reinforced superconducting tape comprising a superconducting tape comprising a superconducting ceramic material, a first metal reinforcing layer having a greater coefficient of thermal expansion than that of the superconducting tape, and a second metal reinforcing layer having a greater modulus of elasticity than the superconducting tape and the first reinforcing layer.

In accordance with another preferred aspect of the present invention there is provided an electric machine, comprising a stator comprising stator coils, a rotor comprising a rotor core, and a coil winding around the rotor core. The coil winding comprises a superconducting tape comprising one or more ceramic superconductor filaments located in a noble metal sheath, a first metal reinforcing layer having a greater coefficient of thermal expansion than that of the superconducting tape, and a second metal reinforcing layer having a greater modulus of elasticity than the superconducting tape and the first reinforcing layer.

In accordance with another preferred aspect of the present invention, there is provided a method of making a reinforced superconducting tape, comprising providing a superconducting tape comprising a superconducting ceramic material, forming a first metal reinforcing layer having a greater coefficient of thermal expansion than that of the superconducting tape, and forming a second metal reinforcing layer having a greater modulus of elasticity than the superconducting tape and the first reinforcing layer.

DETAILED DESCRIPTION

Figure 1:
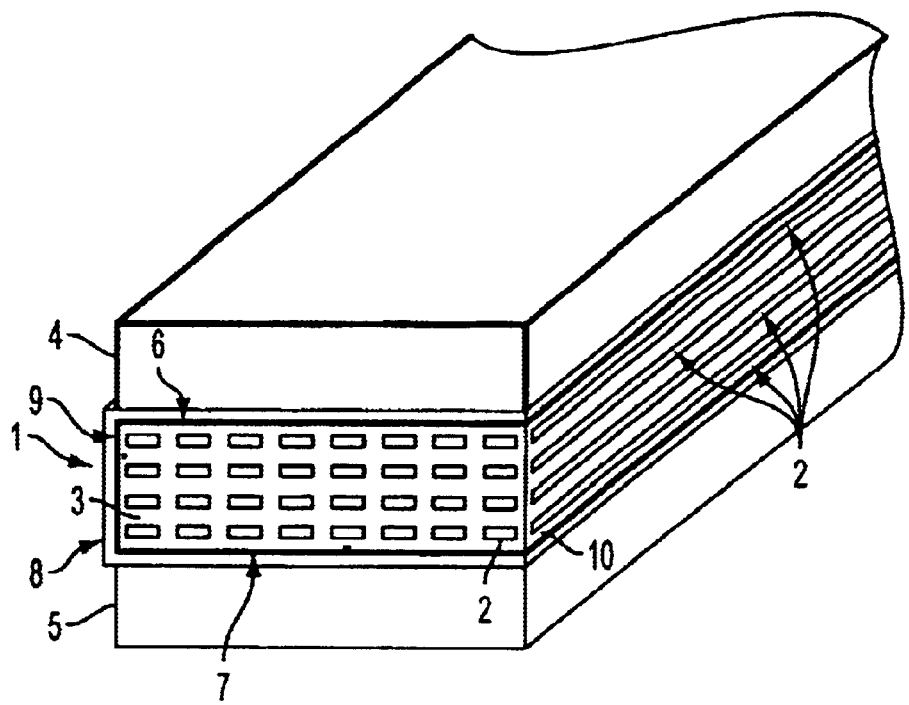
FIG. 1 is a three dimensional cut away view of a reinforced superconducting tape according to a preferred embodiment of the invention.

The present inventors have discovered that while laminating superconducting tape to a metal tape with a greater coefficient of thermal expansion improves the tensile strain tolerance of the superconducting tape, it actually decreases the compressive strain tolerance of the superconducting tape. The present inventors have discovered that the superconducting tape exhibits a different failure mechanism under compression than under tension. Under tension, ceramic cracking is the primary cause for the loss of critical current carrying capability. However, under compression, tape sheath buckling induced superconducting texture damage is the primary cause for the loss of critical current carrying capability. Therefore, the laminated superconducting tape described in U.S. Pat. No. 5,987,342 has an insufficient compressive stress tolerance for some applications, such as for use in generators.

Therefore, the present inventors have realized that a superconducting tape may be reinforced with two different metal reinforcing layers (i.e., "metal" includes pure metal or metal alloy reinforcing layers) to improve both the compressive and the tensile strain tolerance of the superconducting tape. The first metal reinforcing layer should have a coefficient of thermal expansion greater than that of the superconducting tape, to improve the tensile strain tolerance of the superconducting tape. The second metal reinforcing layer should have a greater modulus of elasticity (i.e., Young's modulus) than the superconducting tape and the first reinforcing layer. The term "reinforcing layer" excludes a metal bonding agent, such as solder, which is used to bond a reinforcing layer to the tape. The preferred materials used for the superconducting tape and the reinforcing layers are described in detail below.

I. The Preferred Superconducting Tape Materials

In a preferred embodiment of the present invention, the superconducting tape comprises one or more filaments of ceramic superconductor material sheathed in a metal matrix material to improve the properties of the tape. However, in an alternative aspect of the present invention, the superconducting tape may be unsheathed. The superconductor filaments preferably comprise any ceramic superconducting oxides, especially superconducting copper oxides of the bismuth, rare earth, thallium, lead or mercury families. Preferred materials include $Bi_{1.8}\ Pb_{0.4}\ Sr_2\ Ca_2\ Cu_3\ O_{10+x}$ (BSCCO 2223), $Bi_2\ Sr_2\ Ca_1\ Cu_2\ O_{8+x}$ (BSCCO 2212), and $YBa_2\ Cu_3\ O_{7-x}$ (YBCO 123). The matrix or sheath material preferably comprises any noble metal. A noble metal is a metal or its alloy that does not react with the superconducting ceramic or its precursors during the manufacturing process. Preferred noble metals include gold, silver, silver alloys, such as silver aluminum, silver gold or silver magnesium alloys, or oxide dispersion strengthened (ODS) silver.

The superconducting ceramic material is preferably sheathed when the superconducting tape is manufactured by the powder-in-tube or coated conductor methods, which includes formation of ceramic film coating on a metal substrate. Preferably, the superconducting tape is made by the powder-in-tube method. This method involves packing the ceramic precursor powder into a billet, such as a silver billet, drawing the billet to form a monofilamentary wire, cutting the wire into multiple pieces, and rebundling the wire pieces into one or more noble metal tubes, such as silver, silver alloy or ODS silver tubes, to form a multifilamentary wire. The multifilamentary wire is further drawn and rolled flat into a tape. The tape is then heat treated to convert the ceramic precursor powders into ceramic superconductor filaments. The billets and the tube(5) form the matrix or sheath portion of the tape, while the ceramic filaments form the superconducting portion of the tape.

II. The Preferred First Reinforcing Layer

The first metal reinforcing layer is selected to provide an improved tensile strain tolerance of the superconducting tape by placing the superconducting tape under compression due to the mismatch in the coefficient of thermal expansion between the first metal reinforcing layer and the superconducting tape. The compression occurs because the first metal reinforcing layer is adhered to the superconducting tape at a high temperature. As the reinforcing layer and the tape cool, the reinforcing layer contracts a greater amount than the tape, causing the tape to be placed under compression (i.e., under a compressive stress). The compression prevents or reduces the ceramic cracking of the superconducting tape under tension. Thus, the first metal reinforcing layer material should be selected such that it has a coefficient of thermal expansion value that is at least 5 percent, preferably at least 10 percent, most preferably at least 15 percent greater than that of the superconducting tape. If desired, the first reinforcing layer may be pretensioned at a greater amount than the superconducting tape before being attached to the tape. The pretensioning difference increases the amount of compressive stress placed by the first reinforcing layer on the tape, as disclosed in U.S. Pat. No. 5,987,342, incorporated herein by reference. Preferably, the difference between the coefficient of thermal expansion value of the first metal reinforcing layer and the superconducting tape is greater than the difference in the coefficient of thermal expansion value of the second metal reinforcing layer and the superconducting tape.

If the superconducting tape is sheathed, then the first metal reinforcing layer should have a coefficient of thermal expansion that is greater than the coefficient of thermal expansion of the sheath material of the superconducting tape. Thus, for example, a silver sheath has a coefficient of thermal expansion value of 19.68 $\mu$in/in ° C. Thus, the first metal reinforcing layer should have a coefficient of thermal expansion value greater than 19.68 $\mu$in/in ° C. In a preferred embodiment of the present invention, the first metal reinforcing layer material comprises aluminum or its alloys. Aluminum has a coefficient of thermal expansion value of 23.68 $\mu$in/in ° C., which is about 20 percent (i.e., 19.9 percent) greater than the comparable value of silver. Other materials suitable for the first reinforcing layer include bronze, brass, lead, lead alloys, magnesium, magnesium alloys (such as Mg—Al), tin, tin alloys, zinc and zinc alloys.

III. The Preferred Second Reinforcing Layer

The second metal reinforcing layer is selected to provide improved compressive strain tolerance for the superconducting tape by providing mechanical reinforcement for the superconducting tape to reduce or prevent buckling of the superconducting tape. For example, the second reinforcing layer reduces or prevents the bucking of the relatively soft noble metal sheath formed around the ceramic superconductor filaments, which reduces or prevents texture damage of the ceramic filaments. Thus, the second metal reinforcing layer material should be selected such that it has a greater modulus of elasticity (i.e., Young's modulus) than the superconducting tape and the first reinforcing layer. Preferably, second metal reinforcing layer material has a modulus of elasticity value that is at least 20 percent, preferably at least 100 percent, most preferably at least 200 percent greater than the superconducting tape and the first reinforcing layer.

In a preferred embodiment of the present invention, the second metal reinforcing layer material comprises steel, most preferably stainless steel. Steel has a modulus of elasticity that varies between about 29 and $32 \times 10^6$ psi, depending on steel type. For example, the modulus of elasticity of 2Ni-18Cr stainless steel is $31.2 \times 10^6$ psi. In the example of a silver sheathed superconducting tape (the elastic modulus value of silver is $12 \times 10^6$ psi, and the elastic modulus value of the silver sheathed tape is about the same) and an aluminum first reinforcing layer (elastic modulus value of aluminum is $10.2 \times 10^6$ psi), the stainless steel second reinforcing layer has value of elastic modulus that is more than 250 percent greater than the values of the tape and the first reinforcing layer. Other high elastic modulus metals may be used as the second reinforcing material, such as tungsten, rhodium, rhenium, cobalt, nickel, molybdenum, chromium and their alloys.

IV. The Preferred Methods of Adhering the Reinforcing Layers

The reinforcing layers may be either laminated to the superconducting tape or formed directly on the tape. If one of the reinforcing layers is formed over the other reinforcing layer on the same side of the tape, then the overlying reinforcing layer may be either laminated to or formed directly on the underlying reinforcing layer. If desired, one of the reinforcing layers may be laminated to the underlying tape or layer, while the other reinforcing layer may be formed directly on the underlying tape or layer.

The first and the second reinforcing layers may be laminated to the superconducting tape and/or to each other using a bonding agent, such as solder or epoxy. If desired, the bonding agent may be omitted and solderless mechanical laminating techniques, such as ultrasonic welding, may be used instead to laminate the reinforcing layers to the tape and to each other. For example, the lamination may be carried out by spooling the superconducting tape and metal foils that will be used to form the reinforcing layers from payoffs rolls, passing these tapes through a heated solder bath to form a laminate, cooling the laminate, and rolling up the reinforced superconducting tape laminate onto a take-up roll. Alternatively, the solder lamination may be performed by hand. Lamination methods and apparatus for laminating a metal foil to a superconducting tape are known, and are disclosed, for example, in U.S. Pat. No. 5,987,342 and in C. King et al., "Mechanical Stabilization of BSCCO-2223 Superconducting Tapes", 1996 Applied Superconductivity Conference, Paper MT-9, Pittsburgh, Pa., August 1996, both incorporated herein by reference. The reinforced tape may be wrapped in paper or other insulating material for insulation and impregnated with epoxy for structural reinforcement.

Alternatively, the overlying reinforcing layer may be deposited or formed directly on the underlying tape or the underlying reinforcing layer by any metal deposition method. For example, a reinforcing layer may be directly deposited on the underlying tape or layer by chemical immersion electroless plating, electroplating, hot dip coating, thermal spray coating (i.e., plasma-arc coating, electric-arc spray coating or flame spray coating), evaporation, ion plating, sputtering, chemical vapor deposition (CVD) or solid source diffusion. In solid source diffusion, a solid metal coating source powder, such as an aluminum nitride powder, is combined with a carrier, such as sand, and packed around the tape to be coated. The metal source is then heated to cause atoms of the metal to diffuse to the tape to form a coating on the tape.

V. The Preferred Arrangement of the Reinforcing Layers

In one preferred embodiment of the present invention, the first and the second reinforcing layers may be formed on one long side of the superconducting tape having a rectangular cross section. Preferably, the second reinforcing layer is formed over the first reinforcing layer on one long side of the tape, although the first reinforcing layer may be formed over the second reinforcing layer, if desired. Alternatively, the first and the second reinforcing layers may be formed on opposite long sides of the tape.

In another preferred embodiment of the present invention, the first and the second reinforcing layers are formed on both long sides of the tape. Preferably, the second reinforcing layer is formed over the first reinforcing layer on both long sides of the tape, although the first reinforcing layer may be formed over the second reinforcing layer, if desired. Of course, either the first or the second reinforcing layer may be formed only on one long side of the tape, while the other reinforcing layer may be formed on both long sides of the tape, if desired. Furthermore, one or both reinforcing layers may be formed on more than two sides of the tape, such as on all sides of the tape.

The figures below illustrate some preferred arrangements of the tape and the reinforcing layers. It should be noted that the arrangements are not limited to those illustrated below and any possible arrangement of the tape and the reinforcing layers is within the scope of the present invention.

FIG. 1 illustrates a reinforced superconducting tape 1 according to a first preferred embodiment. The tape 1 includes one or more superconductor ceramic filaments 2 contained in a noble metal sheath or matrix 3. A first metal reinforcing layer 4 is laminated to the first long side 6 of the tape 1. The second metal reinforcing layer 5 is laminated to the second long side 7 of the tape 1. A bonding agent 8, such as epoxy or solder is used to join the reinforcing layers 4, 5 to the tape 1. The bonding agent 8 is also used to seal the short sides 9, 10 of the tape 1. Since the tape 1 preferably has a rectangular cross section, as shown in FIG. 1, the tape 1 has two long sides 6, 7 and two short sides 9, 10. Of course, the tape 1 may have any other desired polygonal, circular or elliptical cross section.

As discussed above, the first reinforcing layer 4 has a greater coefficient of thermal expansion than the tape 1 and the second reinforcing layer 5. The second reinforcing layer 5 has a greater elastic modulus than the first reinforcing layer. Preferably, the tape 1 comprises ceramic superconductor filaments 2 in a silver and/or silver alloy sheath 3, the first reinforcing layer 4 comprises aluminum and the second reinforcing layer 5 comprises stainless steel.

Figure 2:
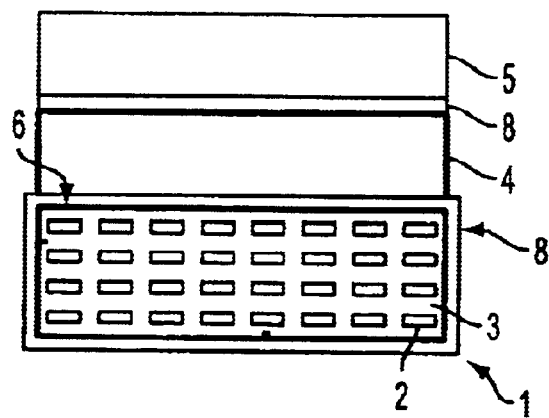
FIGS. 2–7 are front cross sectional views of a reinforced superconducting tape according to preferred embodiments of the invention.

FIG. 2 illustrates a reinforced superconducting tape 1 according to a second preferred embodiment. The reinforced tape 1 of the second embodiment differs from the tape of the first embodiment in that both reinforcing layers 4 and 5 are laminated on the same long side 6 of the tape 1. The bonding agent 8 is formed between side 6 of the tape 1 and layer 4, and between layers 4 and 5.

It is preferred that the first reinforcing layer 4 is located between the tape 1 and the second reinforcing layer 5. However, if desired, the lamination order may be reversed, and second reinforcing layer 5 may be located between the tape 1 and the first reinforcing layer 4. In this case, the thickness of the layer 4 is preferably increased to ensure that it provides a sufficient compressive stress to the tape 1 through layer 5.

Figure 3:
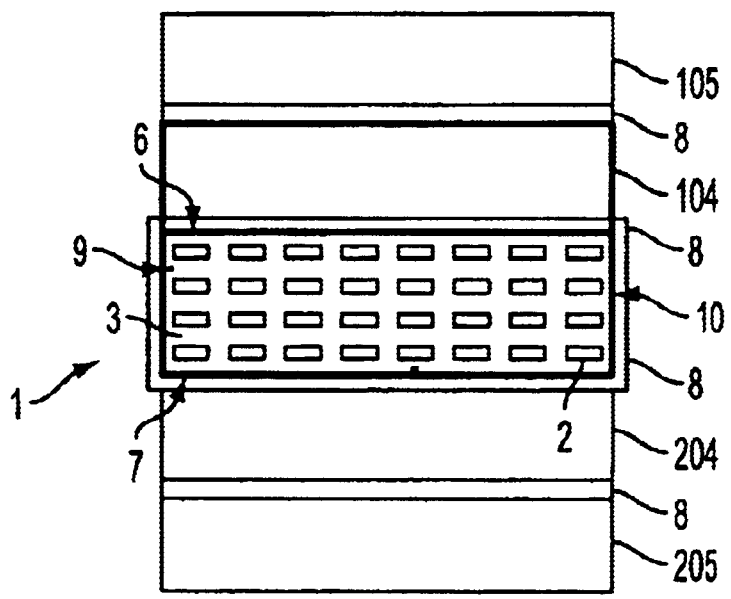

FIG. 3 illustrates a reinforced superconducting tape 1 according to a third preferred embodiment. The reinforced tape 1 of the third embodiment differs from the tape of the first embodiment in that both reinforcing layers are laminated on both long sides 6 and 7 of the tape 1. Thus, a first portion 104 of the first reinforcing layer 4 is located between a first portion 105 of the second reinforcing layer 5 and the first side 6 of the tape. A second portion 204 of the first reinforcing layer 4 is located between a second portion 205 of the second reinforcing layer 5 and the second side 7 of the tape 1. The bonding agent 8 is formed between the long sides 6 and 7 of the tape 1 and the portions 104, 204 of layer 4. The bonding agent 8 is also formed between the portions 104, 204 of layer 4 and the portions 105, 205 of layer 5.

It is preferred that the portions 104, 204 of the first reinforcing layer 4 are located between both sides 6, 7 of the tape 1 and the portions 105, 205 of the second reinforcing layer 5. However, if desired, the lamination order may be reversed. The first portion 105 of the second reinforcing layer 5 may be located between the first side 6 of the tape 1 and the first portion 104 of the first reinforcing layer 4. In addition, if desired, the second portion 205 of the second reinforcing layer 5 may be located between the second side 7 of the tape 1 and the second portion 204 of the first reinforcing layer 4. Furthermore, if desired, the portions of layers 4 and/or 5 may also be located adjacent to the short sides 9, 10 of the tape 1.

Figure 4:
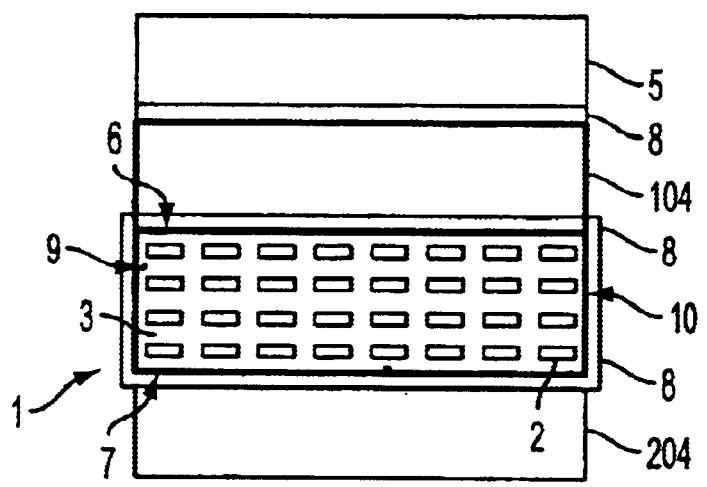

FIG. 4 illustrates a reinforced superconducting tape 1 according to a fourth preferred embodiment. The reinforced tape 1 of the fourth embodiment differs from the tape of the third embodiment in that one reinforcing layer is laminated on both long sides 6 and 7 of the tape 1, while the other reinforcing layer is laminated on one side 6 of the tape 1. Thus, a first portion 104 of the first reinforcing layer 4 is located between the second reinforcing layer 5 and the first side 6 of the tape. A second portion 204 of the first reinforcing layer 4 is laminated to the second side 7 of the tape 1. The bonding agent 8 is formed between the long sides 6 and 7 of the tape 1 and the portions 104, 204 of layer 4. The bonding agent 8 is also formed between the first portion 104 of layer 4 and layer 5.

Alternatively, portions of the second reinforcing layer 5 may be formed over both long sides 6, 7 of the tape 1, while the first reinforcing layer 4 may be formed only over the first long side 6 of the tape 1. Also, as described above, the order to lamination of layers 4 and 5 may be reversed, if desired. Furthermore, the bonding agent 8 may be omitted if ultrasonic bonding or other similar laminating methods are used.

Figure 5:
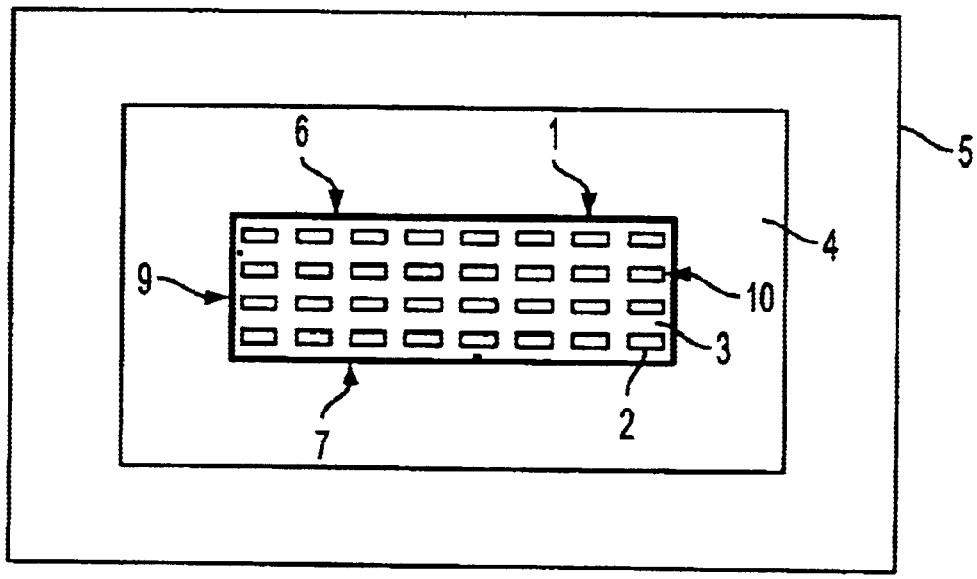

FIG. 5 illustrates a reinforced superconducting tape 1 according to a fifth preferred embodiment. The reinforced tape 1 of the fifth embodiment differs from the tape of the other embodiments in that the reinforcing layers 4, 5 are formed or deposited directly on the underlying tape or layer, rather than being laminated to the underlying tape or layer. For example, as shown in FIG. 5, the first reinforcing layer 4 is directly deposited on every side 6, 7, 9, 10 of the tape 1, and the second reinforcing layer 5 is directly deposited on the first reinforcing layer 4. In this case, the bonding agent 8 may be omitted. However, a bonding agent, such as epoxy, may be formed around the tape if desired. As discussed above, the reinforcing layers 4 and 5 may be formed by any deposition method.

For example, to deposit reinforcing layers 4 and 5 on every surface of the tape, a hot dip coating, an electroplating or an electroless plating method may be used. For example, the first reinforcing layer 4 may comprise plated aluminum, brass, lead, tin, zinc or their alloys (i.e., with each other or with other elements), such as a tin-lead alloy. The second reinforcing layer 5 may comprise plated nickel, chromium, copper or their alloys. Alternatively, the first reinforcing layer may comprise an aluminum layer formed by the solid source diffusion process described above (i.e., an aluminized first reinforcing layer 4 is formed). Of course the first and second reinforcing layers 4, 5 may be formed on all sides of the tape 1 by other processes, such as sputtering, thermal spraying or CVD. Furthermore, the order of deposition may be reversed, and layer 5 may be formed on the tape 1, and layer 4 may be formed on layer 5, if desired.

Figure 6:
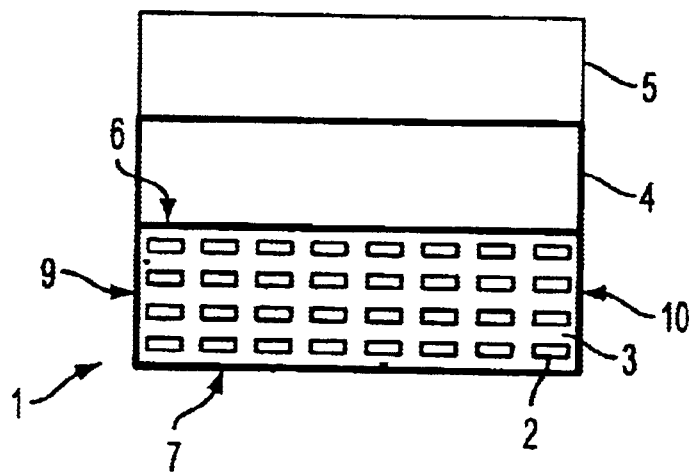

FIG. 6 illustrates a reinforced superconducting tape 1 according to a sixth preferred embodiment. The reinforced tape 1 of the sixth embodiment differs from the tape of the fifth embodiment in that each reinforcing layer 4, 5 is formed or deposited directly over one side of the tape 1. For example, as shown in FIG. 6, both reinforcing layers 4 and 5 are formed over the same side 6 of the tape 1, with the first reinforcing layer 4 being formed on the tape 1, and the second reinforcing layer 5 being formed on the first reinforcing layer 4.

For example, to deposit layer 4 and 5 over one long side of the tape 1, methods such as electroplating, sputtering, evaporation, ion plating, CVD or thermal spraying can be used. Thus, the first reinforcing layer 4 may comprise aluminum formed by electroplating, sputtering or CVD and the second reinforcing layer 5 may comprise tungsten formed by sputtering or CVD.

Alternatively, layer 4 may be formed on the first long side 6 of the tape 1, while layer 5 may be formed on the other long side 7 of the tape 1, similar to the arrangement shown in FIG. 1. Furthermore, one of the reinforcing layers (4 or 5) may be formed over both long sides 6, 7 or over all sides 6, 7, 9 and 10 of the tape 1, while the other reinforcing layer (5 or 4) may be formed only over one long side 6 of the tape 1, similar to the arrangement shown in FIG. 4.

Figure 7:
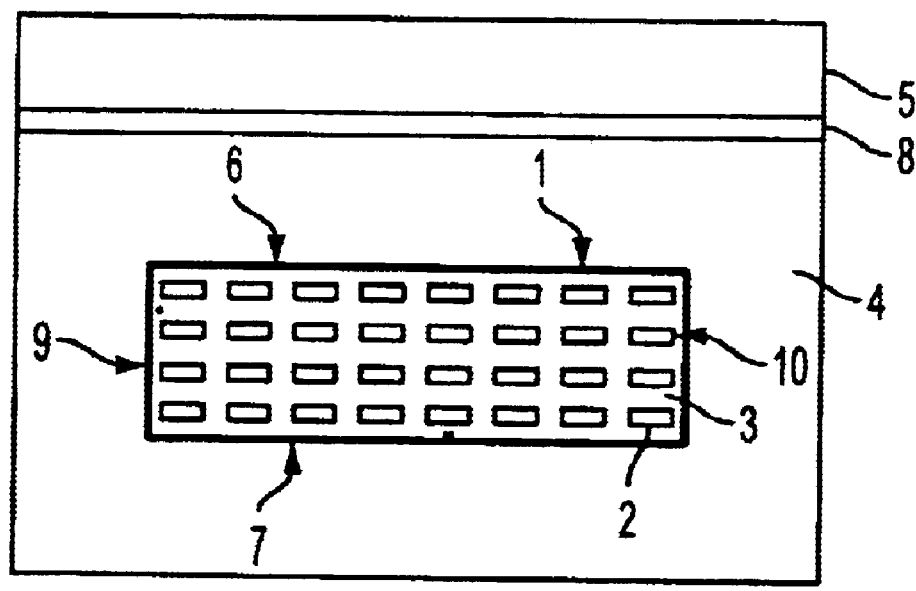

FIG. 7 illustrates a reinforced superconducting tape 1 according to a seventh preferred embodiment. The reinforced tape 1 of the seventh embodiment differs from the tape of the fifth and sixth embodiments in that one reinforcing layer (4 or 5) is formed directly on the underlying tape or layer, while the other reinforcing layer (5 or 4) is laminated to the underlying tape or layer. For example, as shown in FIG. 7, the first reinforcing layer 4 is formed directly on the tape 1, while the second reinforcing layer 5 is laminated to the first reinforcing layer 4 using a bonding agent 8. This arrangement is preferred when the second reinforcing layer 5 comprises stainless steel or another alloy which is difficult to directly deposit as a layer.

The first reinforcing layer 4 may be formed on one long side 6 of the tape, on both long sides 6, 7 of the tape 1 or on all sides 6, 7, 9, 10 of the tape 1. Likewise, the second reinforcing layer 5 may be laminated over one long side 6 of the tape, over both long sides 6 and 7 of the tape 1 or over all sides 6, 7, 9 and 10 of the tape 1. Alternatively, the first reinforcing layer 4 may be laminated to the tape 1 using a bonding agent 8, while the second reinforcing layer 5 is formed directly on the first reinforcing layer 4. Furthermore, the order of layers 4 and 5 may be reversed, as described in the previous embodiments.

The reinforced superconducting tape can have any dimensions. For example, the tape 1 may have a width of about 0.04–2.0 cm or larger, and a thickness of about 0.002–0.08 cm or larger, although smaller tapes may also be used.

The reinforcing layers 4 and 5 that are laminated are preferably metal tapes or foils and typically have a width that is about the same as the width of tape 1 and not more than 0.01 cm less than that of tape 1. Reinforcing tapes or foils typically have a thickness of about 0.002–0.04 cm, preferably about 0.01–0.02 cm. The desired bonding agent 8 (i.e., solder or epoxy) thickness is typically in the range of about 0.0002–0.002 cm, and most preferably about 0.0004–0.001 cm.

The reinforcing layers 4 and 5 that are directly formed on the underlying tape or layer are thin films that have similar dimensions to those described above. The thickness of layers 4 and 5 may be the same or it may be different depending on the materials selected and the desired properties of the reinforced tape.

VI. The Preferred Applications of the Reinforced Tape

The reinforced superconducting tape 1 described above may be used in any desired device or apparatus. For example, the tape 1 may be used in a generator, a motor, a transformer, a magnetic resonance imaging system (MRI) magnet, a magnetic separation device, a power transmission cable or a fault current limiter to name a few. Preferably, the tape 1 is wound in a field coil and used in an electric machine, such as a synchronous electrical machine. A synchronous electric machine includes, but is not limited to, rotary generators, rotary motors, and linear motors. These machines generally comprise a stator and rotor that are electromagnetically coupled. The rotor may include a multi-pole rotor core and one or more superconducting tape coil windings mounted on the rotor core.

Figure 8:
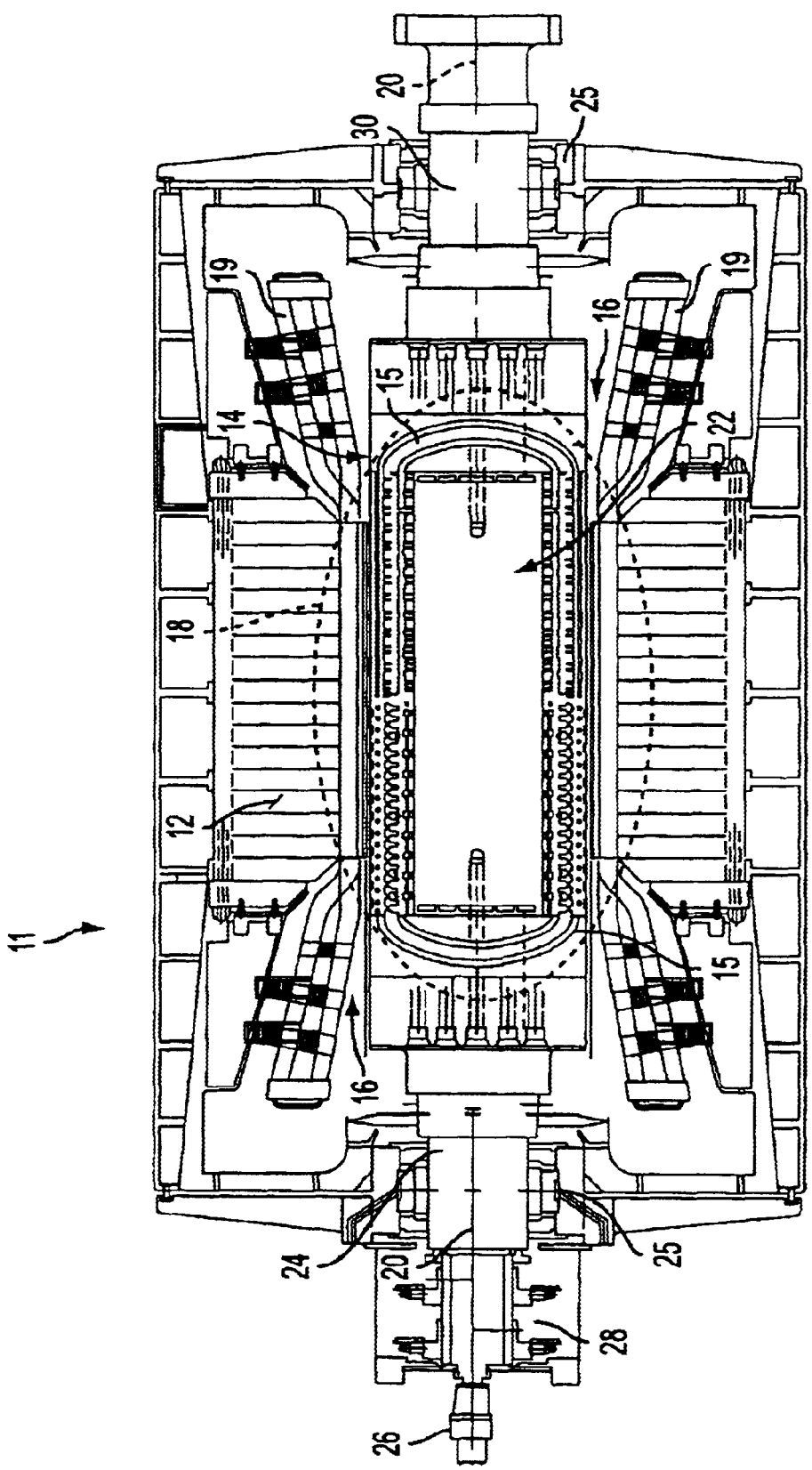
FIG. 8 is a side cross sectional view of a generator tape according to a preferred embodiment of the invention.

In a most preferred embodiment, the reinforced superconducting tape 1 is used in a generator 11 having a stator 12 and a rotor 14, as illustrated in FIG. 8. The rotor 14 includes at least one field winding coil 15 comprising the reinforced superconducting tape 1. The at least one coil 15 is mounted around the rotor 14 core 22. The rotor 14 is located inside a cylindrical rotor vacuum cavity 16 of the stator 12. As the rotor 14 turns within the stator 12, a magnetic field 18 (illustrated by dashed lines) generated by the rotor 14 and the at least one coil 15 moves or rotates through the stator 12 and creates an electrical current in the windings of the stator coils 19. This current is output by the generator as electrical power.

The rotor 14 has a generally longitudinally-extending axis 20 and a generally solid rotor core 22. The solid core 22 has high magnetic permeability, and is usually made of a ferromagnetic material, such as iron. If desired, the solid iron rotor core 22 may be magnetically saturated at an air-gap magnetic field strength of about 2 Tesla.

The rotor 14 includes a pair of end shafts 24, 30. A collector end shaft 24 contains collector rings 28 that provide an external electrical coupling for the coil winding 15. The collector end shaft 24 also includes a cryogen transfer coupling 26 to a source of cryogenic cooling fluid used to cool the coil windings 15 on the rotor 14. The cryogen transfer coupling 26 includes a stationary segment coupled to a source of cryogen cooling fluid and a rotating segment which provides cooling fluid to the coil winding. The opposite end shaft is a drive shaft 30 that may be connected to a power turbine. The end shafts 24, 30 are supported by bearings 25 that provide supports for the entire rotor 14.

Figure 9:
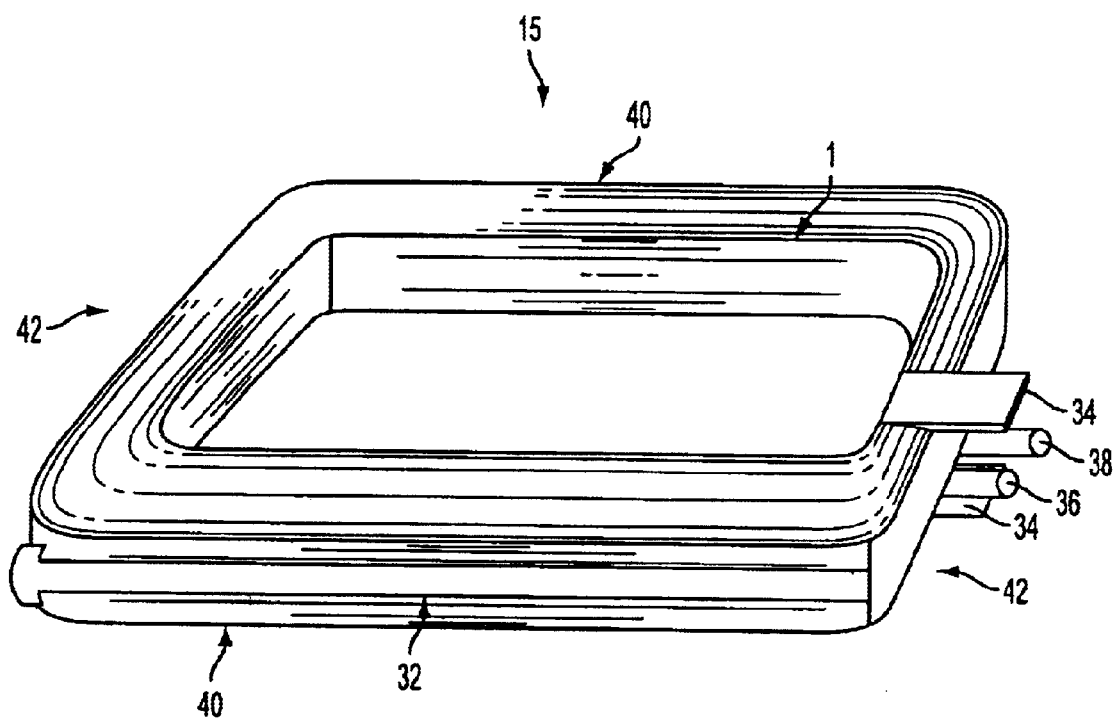
FIG. 9 is a three dimensional view of a racetrack shaped coil winding according to a preferred embodiment of the invention.

FIG. 9 illustrates a high-temperature superconducting coil winding 15 that is mounted to the rotor core 22 according to a preferred embodiment of the present invention. The winding comprises the reinforced superconducting tape 1, at least one cryogen fluid passage 32 and electrical contacts 34, which electrically connect the coil 15 to a commutator.

The at least one fluid cryogen passage 32 extends around an outside edge of the superconducting tape 1. The passageways provide cryogenic cooling fluid to the superconducting tape 1 and remove heat from the tape 1. The cooling fluid maintains the low temperatures in the coil winding 15 needed to promote superconducting conditions, including the absence of electrical resistance in the coil winding 15. The cooling passage 32 has input fluid port 36 and output fluid port 38 at one end of the rotor core 22. These fluid (gas) ports 36, 38 connect the at least one cooling passage 32 on the coil 15 to tubes in the rotor end shaft 24 that extend to the cryogen transfer coupling 26.

The coil winding 15 shown in FIG. 9 is racetrack shaped. Each racetrack coil winding 15 has a pair of generally straight side portions 40 parallel to the rotor axis 20, and a pair of end portions 42 that are curved and perpendicular to the rotor axis, to form a "racetrack" shape. Alternatively, the coil winding 15 may be saddle-shaped or have some other shape that is suitable for a particular rotor design. The dimensions of the racetrack coil 15 are dependent on the dimensions of the rotor core 22. Generally, each racetrack coil 15 encircles the magnetic poles of the rotor core 22, and is parallel to the rotor 14 axis 20. The coil windings 15 are continuous around the racetrack. The ceramic superconductor filaments of the superconducting tape 1 form a resistance free electrical current path around the rotor core 22 and between the magnetic poles of the core.

The coil winding 15 may be made by mounting the core 22 onto a winding hub of a take-up roll and spooling the reinforced superconducting tape 1 from a payoff roll around the core 22. The coil winding 15 may comprise from one to 100 tape layers with 10 to 50 turns per layer for 10 to 5,000 total turns. The cooling passage 32 comprising a stainless steel tube mounted to a copper sheet that is wound around the coil winding 15. The cooling passage may be clamped to the coil winding and wrapped in fiberglass cloth before the entire assembly is potted with epoxy using a vacuum-pressure impregnation cycle, for insulation and structural integrity.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept.

What is claimed is:

1. A reinforced superconducting tape, comprising:
   a superconducting tape comprising a superconducting ceramic material;
   a first metal reinforcing layer having a greater coefficient of thermal expansion than that of the superconducting tape; and
   a second metal reinforcing layer having a greater modulus of elasticity than the superconducting tape and the first reinforcing layer.

2. The tape of claim 1, wherein the superconducting tape comprises one or more ceramic superconductor filaments located in a noble metal sheath.

3. The tape of claim 2, wherein the first reinforcing layer places the superconducting tape under compression due to its greater coefficient of thermal expansion.

4. The tape of claim 3, wherein the value of the coefficient of thermal expansion of the first reinforcing layer is at least 10 percent greater than the value of the coefficient of thermal expansion of the sheath of the superconducting tape.

5. The tape of claim 4, wherein the second reinforcing layer material has a modulus of elasticity value that is at least 100 percent greater than the modulus of elasticity value of the superconducting tape and the first reinforcing layer.

6. The tape of claim 5, wherein:
   the ceramic superconductor filaments comprise a plurality of filaments selected from a group consisting of BSCCO 2223, BSCCO 2212, and YBCO 123;
   the sheath comprises at least one of gold, silver, silver alloy and oxide dispersion strengthened silver;
   the first reinforcing layer is selected from a group consisting of aluminum, aluminum alloys, bronze, brass, lead, lead alloys, magnesium, magnesium alloys, tin, tin alloys, zinc and zinc alloys; and
   the second reinforcing layer is selected from a group consisting of stainless steel, tungsten, rhodium, rhenium, cobalt, nickel, molybdenum, chromium and their alloys.

7. The tape of claim 6, wherein:
   the first reinforcing layer comprises aluminum;
   the second reinforcing layer comprises stainless steel; and
   the sheath comprises one or more of silver, silver alloy and oxide dispersion strengthened silver.

8. The tape of claim 1, wherein the first reinforcing layer, the second reinforcing layer and superconducting tape are laminated with a bonding agent.

9. The tape of claim 8, wherein the bonding agent comprises epoxy or solder located between the superconducting tape and the first reinforcing layer and between the first reinforcing layer and the second reinforcing layer.

10. The tape of claim 1, wherein at least one of the first and the second reinforcing layers is directly deposited on the superconducting tape.

11. The tape of claim 10, wherein the first reinforcing layer is directly deposited on the superconducting tape, and the second reinforcing layer is formed on the first reinforcing layer.

12. The tape of claim 1, wherein:
   the first reinforcing layer is formed over a first side of the superconducting tape; and
   the second reinforcing layer is formed over a second side of the superconducting tape.

13. The tape of claim 1, wherein:
   the first reinforcing layer is formed over a first side of the superconducting tape; and the second reinforcing layer is formed over a first side of the first reinforcing layer.

14. The tape of claim 1, wherein:
a first portion of the first reinforcing layer is formed over a first side of the superconducting tape and a second portion of the first reinforcing layer is formed over a second side of the superconducting tape; and
a first portion of the second reinforcing layer is formed over the first portion of the first reinforcing layer and a second portion of the second reinforcing layer is formed over the second portion of the first reinforcing layer.

15. The tape of claim 1, wherein:
a first portion of the first reinforcing layer is formed over a first side of the superconducting tape and a second portion of the first reinforcing layer is formed over a second side of the superconducting tape; and
the second reinforcing layer is formed over the first portion of the first reinforcing layer.

16. The tape of claim 1, wherein:
the first reinforcing layer is formed over every side of the superconducting tape; and
the second reinforcing layer is formed over every side of the first reinforcing layer.

17. The tape of claim 1, wherein:
the first reinforcing layer is directly deposited on every side of the superconducting tape; and
the second reinforcing layer is laminated to a first side of the first reinforcing layer.

18. The tape of claim 1, wherein the reinforced superconducting tape is formed into a coil.

19. The tape of claim 1, wherein the reinforced superconducting tape is located in a generator, a motor, a transformer, a magnetic resonance imaging system (MRI) magnet, a magnetic separation device, a power transmission cable or a fault current limiter.

20. The tape of claim 19, wherein the reinforced superconducting tape coil is wound around a rotor core of a generator which comprises a rotor comprising the rotor core and a stator comprising stator coils.

21. An electric machine, comprising:
a stator comprising stator coils;
a rotor comprising a rotor core; and
a coil winding around the rotor core, the coil winding comprising:
a superconducting tape comprising one or more ceramic superconductor filaments located in a noble metal sheath;
a first metal reinforcing layer having a greater coefficient of thermal expansion than that of the superconducting tape; and
a second metal reinforcing layer having a greater modulus of elasticity than the superconducting tape and the first reinforcing layer.

22. The machine of claim 21, wherein:
the value of the coefficient of thermal expansion of the first reinforcing layer is at least 10 percent greater than the value of the coefficient of thermal expansion of the sheath of the superconducting tape, such that the first reinforcing layer places the superconducting tape under compression due to its greater coefficient of thermal expansion; and
the second reinforcing layer material has a modulus of elasticity value that is at least 100 percent greater than the modulus of elasticity value of the superconducting tape and the first reinforcing layer.

23. The machine of claim 22, wherein:
the ceramic superconductor filaments comprise a plurality of filaments selected from a group consisting of BSCCO 2223, BSCCO 2212, and YBCO 123;
the sheath comprises at least one of gold, silver, silver alloy and oxide dispersion strengthened silver;
the first reinforcing layer is selected from a group consisting of aluminum, aluminum alloys, bronze, brass, lead, lead alloys, magnesium, magnesium alloys, tin, tin alloys, zinc and zinc alloys; and
the second reinforcing layer is selected from a group consisting of stainless steel, tungsten, rhodium, rhenium, cobalt, nickel, molybdenum, chromium and their alloys.

24. The machine of claim 21, wherein:
the electric machine comprises a generator; and
the coil winding is racetrack shaped.

25. The machine of claim 24, further comprising:
a cryogen fluid passage formed around the coil winding; and
electric contacts connected to the coil winding.

26. A method of making a reinforced superconducting tape, comprising:
providing a superconducting tape comprising a superconducting ceramic material;
forming a first metal reinforcing layer having a greater coefficient of thermal expansion than that of the superconducting tape; and
forming a second metal reinforcing layer having a greater modulus of elasticity than the superconducting tape and the first reinforcing layer.

27. The method of claim 26, wherein:
the superconducting tape comprises one or more ceramic superconductor filaments located in a noble metal sheath;
the value of the coefficient of thermal expansion of the first reinforcing layer is at least 10 percent greater than the value of the coefficient of thermal expansion of the sheath of the superconducting tape, such that the first reinforcing layer places the superconducting tape under compression due to its greater coefficient of thermal expansion; and
the second reinforcing layer material has a modulus of elasticity value that is at least 100 percent greater than the modulus of elasticity value of the superconducting tape and the first reinforcing layer.

28. The method of claim 27, wherein the step of providing the superconducting tape comprises:
packing a ceramic precursor powder into a noble metal billet; drawing the billet to form a monofilamentary wire;
cutting the wire into multiple pieces;
rebundling the wire pieces into at least one noble metal tube to form a multifilamentary wire;
drawing the multifilamentary wire;
rolling the drawn multifilamentary wire into a tape; and
heat treating the tape to convert the ceramic precursor powder into ceramic superconductor filaments, such that the billet and the at least one tube form a sheath portion of the tape and the ceramic filaments form a superconducting portion of the tape.

29. The method of claim 28, wherein:
the ceramic superconductor filaments comprise a plurality of filaments selected from a group consisting of BSCCO 2223, BSCCO 2212, and YBCO 123;

the sheath comprises at least one of gold, silver, silver alloy and oxide dispersion strengthened silver;

the first reinforcing layer is selected from a group consisting of aluminum, aluminum alloys, bronze, brass, lead, lead alloys, magnesium, magnesium alloys, tin, tin alloys, zinc and zinc alloys; and the second reinforcing layer is selected from a group consisting of stainless steel, tungsten, rhodium, rhenium, cobalt, nickel, molybdenum, chromium and their alloys.

30. The method of claim 26, further comprising:

forming a bonding agent over at least a first side of the superconducting tape;

forming one of the first reinforcing layer and the second reinforcing layer on the bonding agent located on at least the first side of the superconducting tape;

forming a bonding agent over at least one of a second side of the superconducting tape and the reinforcing layer formed over the first side of the superconducting tape; and forming the other one of the first reinforcing layer and the second reinforcing layer on the bonding agent located on the at least the second side of the superconducting tape or on the formed reinforcing layer.

31. The method of claim 30, wherein:

the first reinforcing layer is formed on the bonding agent located on at least the first side of the superconducting tape; and the second reinforcing layer is formed on the bonding agent located on the second side of the superconducting tape.

32. The method of claim 30, wherein the first reinforcing layer is formed on the bonding agent located on at least the first side of the superconducting tape; and the second reinforcing layer is formed on the bonding agent located on the first reinforcing layer.

33. The method of claim 26, further comprising directly depositing at least one of the first and the second reinforcing layers on the superconducting tape.

34. The method of claim 33, wherein the at least one of the first and the second reinforcing layers is directly deposited on the superconducting tape by electroless plating, electroplating, hot dip coating, thermal spray coating, evaporation, ion plating, sputtering, chemical vapor deposition or solid source diffusion.

35. The method of claim 34, wherein:

the first reinforcing layer is formed on the superconducting tape by electroless plating, electroplating or hot dip coating; and the second reinforcing layer is directly deposited on the first reinforcing layer or is laminated to the first reinforcing layer.

36. The method of claim 26, further comprising placing the reinforced superconducting tape into a generator, a motor, a transformer, a magnetic resonance imaging system (MRI) magnet, a magnetic separation device, a power transmission cable or a fault current limiter.

37. The method of claim 36, further comprising:

mounting a generator rotor core onto a winding hub of a take up roll;

spooling the reinforced superconducting tape from a payoff roll around the rotor core to form a racetrack shaped coil winding;

attaching a cryogen cooling passage around the coil winding; and placing the rotor core, the coil winding and the cooling passage into a rotor cavity located in a stator of a generator.

* * * * *